(12) United States Patent
Weng et al.

(10) Patent No.: US 11,785,823 B2
(45) Date of Patent: Oct. 10, 2023

(54) QUANTUM DOT DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Dezhi Weng, Wuhan (CN); Gaozhen Wang, Wuhan (CN); Tao Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 394 days.

(21) Appl. No.: 17/113,872

(22) Filed: Dec. 7, 2020

(65) Prior Publication Data
US 2021/0343793 A1  Nov. 4, 2021

(30) Foreign Application Priority Data
Apr. 30, 2020 (CN) .......................... 202010361459.X (51) Int. Cl.
*H10K 59/38* (2023.01)
*H10K 50/115* (2023.01)
(Continued)

(52) U.S. Cl.
CPC ........... *H10K 59/38* (2023.02); *H10K 50/115* (2023.02); *H10K 50/844* (2023.02); *H10K 71/00* (2023.02)

(58) Field of Classification Search
CPC .... H10K 50/115; H10K 50/844; H10K 59/38; H10K 71/00; H10K 71/40; H10K 71/421; H10K 71/441
(Continued)

(56) References Cited

U.S. PATENT DOCUMENTS

| 2007/0200492 A1 | 8/2007 | Cok et al. |
| 2014/0027724 A1 | 1/2014 | Lim et al. |

(Continued)

FOREIGN PATENT DOCUMENTS

| CN | 103227189 A | 7/2013 |
| CN | 103236435 A | 8/2013 |

(Continued)

*Primary Examiner* — Matthew E. Gordon
(74) *Attorney, Agent, or Firm* — PV IP PC; Wei Te Chung; Zhigang Ma (57) ABSTRACT

A quantum dot display panel and a manufacturing method thereof are provided. The quantum dot display panel includes an array substrate; a luminescent layer disposed on the array substrate; an encapsulation layer disposed on the luminescent layer; and a color filter layer disposed on the encapsulation layer. The color filter layer includes a plurality of pixel areas. Each of the plurality of pixel areas includes a plurality of sub-pixel filter layers. Each of the sub-pixel filter layers is made of a quantum dot material. A color of a light excited by the quantum dot material is the same as a color of the sub-pixel filter layer. An upper surface of at least one of the sub-pixel filter layers forms a concave structure. The quantum dot display panel provided by the embodiment of the present disclosure enhances the light extraction rate and the display effect of the quantum dot display panel.

20 Claims, 2 Drawing Sheets

(51) Int. Cl.
   *H10K 50/844*   (2023.01)
   *H10K 71/00*    (2023.01)
(58) Field of Classification Search
   USPC .................................................... 257/13, 40
   See application file for complete search history.

(56) References Cited

U.S. PATENT DOCUMENTS

| | | |
|---|---|---|
| 2015/0145405 A1 | 5/2015 | Yang et al. |
| 2016/0266436 A1 | 9/2016 | Jiao et al. |
| 2017/0125740 A1 | 5/2017 | Lee et al. |
| 2018/0226597 A1 | 8/2018 | Byun et al. |
| 2018/0374904 A1 | 12/2018 | Xu |
| 2019/0137815 A1* | 5/2019 | Kim .................. G02F 1/133512 |
| 2019/0148460 A1 | 5/2019 | Kim et al. |
| 2020/0041837 A1 | 2/2020 | Jiang et al. |
| 2020/0119101 A1 | 4/2020 | Lee |
| 2020/0127056 A1* | 4/2020 | Guo ....................... H10K 59/38 |

FOREIGN PATENT DOCUMENTS

| | | |
|---|---|---|
| CN | 104728779 A | 6/2015 |
| CN | 106229418 A | 12/2016 |
| CN | 108169957 A | 6/2018 |
| CN | 109065740 A | 12/2018 |
| CN | 110323354 A | 10/2019 |
| CN | 110491924 A | 11/2019 |
| JP | 2005293946 A | 10/2005 |

* cited by examiner

QUANTUM DOT DISPLAY PANEL AND MANUFACTURING METHOD THEREOF

BACKGROUND OF INVENTION

Field of Invention

The present disclosure relates to the field of display technology, and more particularly, to quantum dot display panel and a manufacturing method thereof.

Description of Prior Art

Quantum dot light-emitting diodes (QLED) are recognized by the industry as the most promising display devices because of their advantages of high brightness, wide color gamut, long service life, and high internal quantum efficiency. In particular, the use of quantum dot printed color filter substrate (Color Filter, CF) may replace the polarizer, which greatly improves the light output ratio, and the process cost is also greatly reduced, becoming the main direction of future display research.

However, in the structure of a conventional device, due to the microcavity effect of the printed color filter substrate, the light extraction rate is reduced. The photons generated in the quantum dot color filter substrate layer are totally reflected at the interface layer due to the optical waveguide effect, and parts of the photons are limited within the color filter substrate, thereby causing energy loss and affecting the display effect of the display panel.

SUMMARY OF INVENTION

Embodiments of the present disclosure provide a quantum dot display panel, a manufacturing method thereof, and a display device, which aim to improve the structure of the quantum dot display panel and enhance the display effect of the quantum dot display panel.

In one aspect, the present disclosure provides a quantum dot display panel. The quantum dot display panel comprises:
an array substrate;
a luminescent layer disposed on the array substrate configured to provide a light source;
an encapsulation layer disposed on the luminescent layer, and configured to encapsulate the luminescent layer; and
a color filter layer disposed on the encapsulation layer. The color filter layer comprises a plurality of pixel areas. Each of the plurality of pixel areas comprises a plurality of sub-pixel filter layers. Each of the sub-pixel filter layers is made of a quantum dot material, and a color of a light emitted by the quantum dot material after being excited is the same as a color of the sub-pixel filter layer. An upper surface of at least one of the sub-pixel filter layers forms a concave structure.

In one embodiment, the quantum dot display panel further comprises a light transmission layer formed on the color filter layer. A refractive index of the light transmission layer is higher than a refractive index of the color filter layer.

In one embodiment, the light transmission layer comprises a light transmission part. The light transmission part is disposed opposite to the sub-pixel filter layer, and a lower part of the light transmission part is filing in the concave structure.

In one embodiment, the color filter layer further comprises an interval section. There are a plurality of sub-pixel filter layers, and the plurality of sub-pixel filter layers are disposed at intervals by the interval section.

In one embodiment, a height of the sub-pixel filter layer is less than or equal to a height of the interval section.

In one embodiment, the organic solvent comprises one or more of aromatic hydrocarbon, ether, and alcohol.

In one embodiment, the upper surface of the at least one of the sub-pixel filter layers forms a plurality of concave structures. The plurality of concave structures is disposed opposite to the plurality of sub-pixel filter layers. Shapes of the plurality of concave structures are the same.

In one embodiment, the luminescent layer is a blue light source. A first red sub-pixel filter layer on the color filter layer is made of a red quantum dot material, a second green sub-pixel filter layer is made of a green quantum dot, and the sub-pixel filter layer corresponding to a third blue sub-pixel filter layer is a transparent region.

In another aspect, the present disclosure provides method of manufacturing a quantum dot display panel, comprising:
providing an array substrate;
disposing a luminescent layer on the array substrate configured to provide a light source;
disposing an encapsulation layer on the luminescent layer, and configured to encapsulate the luminescent layer;
disposing a color filter layer on the encapsulation layer. The color filter layer comprises a plurality of pixel areas. Each of the pixel areas comprises a plurality of sub-pixel filter layers. Each of the plurality of sub-pixel filter layers is made of a quantum dot material, and a color of a light emitted by the quantum dot material after being excited is the same as a color of the sub-pixel filter layer; and
forming a concave structure on an upper surface of the sub-pixel filter layer.

In one embodiment, a step of disposing the color filter layer on the encapsulation layer comprises:
disposing an interval section on the encapsulation layer, and the interval section comprises a plurality of openings to form a plurality of interval regions; and
disposing the plurality of sub-pixel filter layers in the plurality of openings to form the color filter layer, and the plurality of sub-pixel filter layers is disposed at intervals by the interval section.

In one embodiment, the method further comprises:
disposing a light transmission part in the concave structure to form a light transmission layer.

The beneficial effect of the display panel provided by the embodiments of the present disclosure is that: the exit angle of light in the color filter layer of the quantum dot display panel may be changed by forming the concave structure on the upper surface of the color filter layer of the quantum dot display panel. It reduces the probability of total internal reflection of light on the surface of the color filter layer of the quantum dot display panel, and more light in the color filter layer may be emitted from the quantum dot display panel, which greatly enhances the light extraction rate and the display effect of the quantum dot display panel.

BRIEF DESCRIPTION OF DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings can also be obtained from those skilled persons in the art based on these drawings without making any creative effort.

DETAILED DESCRIPTION OF PREFERRED EMBODIMENTS

The technical solutions in the embodiments of the present disclosure will be described clearly and completely in combined with the drawings shown in the embodiments of the present disclosure. Obviously, the described embodiments are only one part of the embodiments of the present disclosure, but not all of the embodiments. Based on the embodiments of the present disclosure, all other embodiments obtained by a person skilled in the art without making creative efforts fall within the claim scope of the present disclosure.

In the description of the present disclosure, it should be understood that the terms, such as "central," "longitudinal," "transversal," "length," "width," "thickness," "upper," "lower," "front," "back," "left," "right," "vertical," "horizontal," "top," "bottom," "inside," "outside," etc. are based on the orientational or positional relationship shown in the drawings, and the terms are merely for convenience of description of the present disclosure, rather than indicating or implying that the device or element referred to must have a specific orientation, be constructed and operate in a specific orientation, and thus cannot be construed as limiting the present disclosure. In addition, the terms "first" and "second" are merely used for description purposes, and cannot be understood as indicating or implying relative importance or implicitly indicating the number of indicated technical features. Thus, features defined as "first" and "second" may explicitly or implicitly include one or more of the features. In the description of the present disclosure, the meaning of "a plurality of" is two or more than two, unless otherwise specifically limited.

In this application, the term "exemplary" is used to indicate "used as an example, illustration, or explanation." Any embodiment described as "exemplary" in this application is not necessarily to be construed as preferred or more preferred over other embodiments. In order to enable any person skilled in the art to implement and use the present disclosure, the following description is given. In the following description, details are listed for explanatory purposes. It should be understood that a person skilled in the art may recognize that the present disclosure can be implemented without using these specific details. In other examples, well-known structures and processes will not be elaborated in detail in order to avoid unnecessary details that obscure the description of the present disclosure. Therefore, the present disclosure is not intended to be limited to the illustrated embodiments, but is consistent with the widest scope of the principles and features disclosed in this application.

A quantum dot material refers to an inorganic semiconductor nanocrystal grains with a particle size between 1-100 nm. Due to the quantum confinement of electrons and holes, the continuous energy band structure becomes a discrete energy level structure with molecular characteristics. The quantum dot material may emit fluorescence after being excited.

The embodiment of the present disclosure provides a quantum dot display panel and a method of manufacturing thereof. The details are described below.

Figure 1:
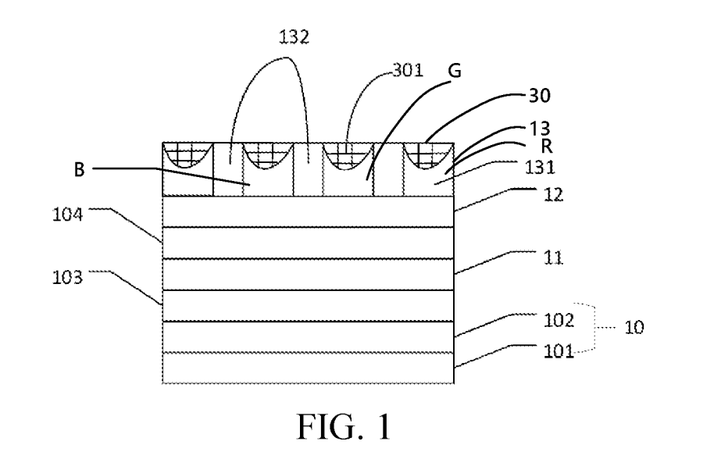
FIG. 1 is a schematic view of the quantum dot display panel according to one embodiment of the present disclosure.

Referring to FIG. 1, it is a schematic view of the quantum dot display panel according to one embodiment of the present disclosure. The display panel comprises:

an array substrate 10;

a luminescent layer 11 disposed on the array substrate 10 configured to provide a light source;

an encapsulation layer 12 disposed on the luminescent layer 11, and configured to encapsulate the luminescent layer 11; and a color filter layer 13 disposed on the encapsulation layer 12. The color filter layer 13 comprises a plurality of pixel areas. Each of the plurality of pixel areas comprises a plurality of sub-pixel filter layers. Each of the sub-pixel filter layers is made of a quantum dot material, and a color of a light emitted by the quantum dot material is the same as a color of the sub-pixel filter layer. An upper surface of at least one of the sub-pixel filter layer forms a concave structure.

The display panel provided by the embodiments of the present disclosure may change the exit angle of light in the color filter layer of the quantum dot display panel by forming the concave structure on the upper surface of the color filter layer of the quantum dot display panel. It reduces the probability of total internal reflection of light on the surface of the color filter layer of the quantum dot display panel, and more light in the color filter layer may be exited from the quantum dot display panel, which greatly enhances the light extraction rate and the display effect of the quantum dot display panel.

Specifically, referring to FIG. 1, in one embodiment of the display panel provided by the present disclosure, the array substrate 10 may comprise:

a glass substrate 101; and a thin film transistor layer 102 disposed on the glass substrate 101.

In some embodiments of the present disclosure, a cathode 103, an anode 104, and a luminescent layer 11 may also be disposed on the array substrate 10. The cathode 103 is disposed on the thin-film transistor layer 102. The luminescent layer 11 is disposed on the array substrate 10 and located between the cathode 103 and the anode 104. The light-emitting layer 11 is used to provide a light source. The anode 104 is disposed on the luminescent layer 11.

In some embodiments, the color filter layer 13 is disposed on the anode 104. The color filter layer 13 comprises a plurality of pixel areas, and each of the pixel areas further comprises a plurality of sub-pixel filter layers 131. The upper surface of the color filter layer 13 forms a concave structure. The concave structure may reduce the probability of total internal reflection of light on the surface of the color filter layer 13, allowing more light in the color filter layer 13 to exit from the surface of the quantum dot display panel, and greatly enhancing the light extraction rate and the display effect of the quantum dot display panel.

The quantum dot display panel provided by the present disclosure comprises a color filter layer 13 made of a quantum dot material. The color filter layer 13 comprises a plurality of pixel areas, and each of the pixel areas comprises a plurality of sub-pixel filter layers 131. Each of the sub-pixel filter layers 131 corresponds to one color. A color of the light emitted by the quantum dot material after being excited is the same as a color corresponding to one of the sub-pixel filter layers 131. As such, the color filter layer 13 made of the quantum dot material may emit colored light.

In some embodiments, the pixel areas may comprise a plurality of sub-pixel filter layers 131. Specifically, one pixel area may comprise three sub-pixel filter layers 131.

Based on the above embodiment, when a blue backlight is used as a light source, that is, the luminescent layer 11 is a blue light source, at least a red sub-pixel filter layer R and a green sub-pixel filter layer G are arranged on the pixel area of the color filter layer 13. The red sub-pixel filter layer R and the green sub-pixel filter layer G are made of the quantum dot material. The red sub-pixel filter layer R emits red light under the excitation of the backlight, and the green sub-pixel filter layer G emits green light under the excitation of the backlight.

In the above embodiment, a transparent sub-pixel filter layer may be further disposed on the pixel areas. A color corresponding to the transparent sub-pixel filter layer is the color of the backlight, that is, blue. Since the backlight selects blue, the pixel areas may display the primary colors of red, green, and blue, and other color that composed of the three primary colors of red, green, and blue under backlight illumination to achieve colored light filtering.

In other embodiments, the transparent sub-pixel filter layer may be prepared by a blue sub-pixel filter layer B. The blue sub-pixel filter layer B is also made of the quantum dot material. The blue sub-pixel filter layer B may emit blue light under the excitation of the backlight.

Of course, a white sub-pixel filter layer W may also be disposed on the pixel areas. The white sub-pixel filter layer is also made of the quantum dot material, and the white sub-pixel filter layer may emit white light under the excitation of the backlight. Displaying pictures through RGBW is beneficial to enhance the brightness and contrast of the display panel.

In some embodiments of the present disclosure, the quantum dot display panel further comprises a light transmission layer 30 disposed on the color filter layer 13, and a refractive index of the light transmission layer 30 is higher than a refractive index of the color filter layer 13.

Specifically, an upper surface of the color filter layer 13 forms a concave structure, and the light transmission layer 30 is disposed in the concave structure. Preferably, the light transmission layer 30 may comprise at least one light transmission part 301. Preferably, there are a plurality of the sub-pixel filter layers 131 and a plurality of the light transmission parts 301, and the numbers of the sub-pixel filter layers 131 and the light transmission part 301 are equal. That is, the light transmission part 301 is disposed on each of the plurality of sub-pixel filter layers 131. The light transmission part 301 correspondingly covers the concave structure. Each of the plurality of concave structures is disposed corresponding to each of the plurality of sub-pixel filter layers 131. When there are the plurality of the sub-pixel filter layers 131 and the plurality of the transmission parts 301, the plurality of the concave structures are also provided, and the shapes of the plurality of the concave structures may be the same or may be different.

In some embodiments, the upper surface of the sub-pixel filter layer 131 is a concave structure, and the curvature and radius of the concave structure change with the distance between the sub-pixel filter layers 131 in different display panels. The concave structure allows the transmission path of the light entering the sub-pixel filter layer 131 to be changed, so that more light may exit from the sub-pixel filter layer 131. A light transmission part 301 is disposed in the concave structure of the at least one of the sub-pixel filter layers 131, allowing a part of the light from the luminescent layer 11 to be directly emitted from the sub-pixel filter layers 131 after entering the sub-pixel filter layers 131. Since the refractive index of the light transmission layer 30 is higher than the refractive index of the color filter layer 13, the other part of the light, which is originally lost due to the total internal reflection in the color filter layer 13, may also be emitted directly from the sub-pixel filter layers 131. It further enhances the light extraction rate and the display effect of the display panel.

In one embodiment of the present disclosure, the light transmission layer 30 is disposed in the concave structure of the color filter layer 13. It may not only prevent the moisture remaining inside the display panel from penetrating into the organic luminescent layer to erode the device, causing abnormal display, but also avoid the residual moisture to be shrunk/expanded due to affection by temperature, which affects the service life of the display panel.

In some embodiments, when there are the plurality of sub-pixel filter layers 131, the display panel further comprises an interval section 132, and the interval section 132 comprises a plurality of openings. The plurality of pixel areas are disposed at intervals by the interval section 132, and the plurality of sub-pixels filter layers 131 are also disposed at intervals by the interval section 132. A side surface of each of the plurality of sub-pixel filter layers 131 is directly contacted with a sidewall of each of the plurality of openings. A side surface of each of the plurality of light transmission parts 301 is directly contacted with a sidewall of each of the plurality of openings. The height of the sub-pixel filter layer 131 is less than or equal to the height of the interval section 132. The interval section 132 may not only be used to space the sub-pixel filter layers 131 apart and block gaps between the sub-pixel filter layers 131, but also may prevent light leakage and color mixing in the quantum dot display panel.

In some embodiments, the interval section 132 may have a cross-shaped structure, that is, an opening is formed between the adjacent spacers 132, and the sub-pixel filter layer 131 is formed at the opening. The upper surface of the interval section 132 may be a flat.

The sub-pixel filter layer 131 is disposed at the opening of the interval section 132, and the light transmission part 301 is disposed within the concave structure of the sub-pixel filter layer 131. The upper surface of the light transmission part 301 may have a flat or a concave structure. The height difference between the upper surface of the light transmission part 301 and the upper surface of the spacer is within a predetermined range. In some embodiments of the present disclosure, the lower part of the light transmission portion 301 may fill the concave structure.

In some embodiments, the height difference between the upper surface of the light transmitting portion 301 and the upper surface of the interval section 132 is less than or equal to 0.2 μm. That is, the height of the upper surface of the light transmission part 301 is less than or equal to the height of the upper surface of the interval section 132. Specifically, the upper surface of the light transmission part 301 may be a flat, and the height of the upper surface of the light transmission part 301 is equal to the height of the upper surface of the interval section 132; or the height difference between the lowest point of the upper surface of the light transmission portion 301 and the upper surface of the interval section may be 0.1 μm, 0.15 μm, 0.2 μm.

The quantum dot display panel provided by the embodiment of the present disclosure further comprises an encapsulation layer 12. The encapsulation layer 12 is disposed on the luminescent layer 11 for encapsulating the luminescent layer 11 to prevent the luminescent layer 11 from being eroded by moisture. The color filter layer 13 is disposed on the encapsulation layer 12. The encapsulation layer 12 may be an overlapping arrangement of an inorganic layer/an organic layer/an inorganic layer, which provides a better encapsulation effect.

It should be noted that the embodiments of the display panel described above merely describe the above structures. It should be understood that, in addition to the above structures, the display panel of the embodiment of the present disclosure may comprise any other essential structures, such as a hole injection layer, a hole transport layer, etc. which are not specifically limited herein.

Figure 2:
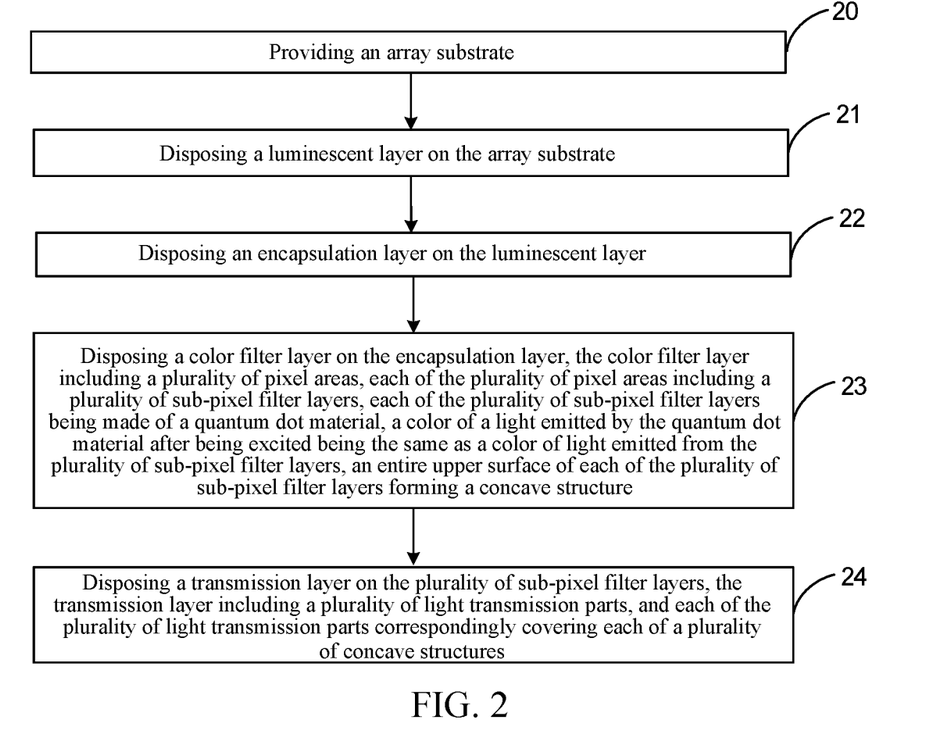
FIG. 2 is a flowchart of a method of manufacturing the display panel according to one embodiment of the present disclosure.

The present disclosure further provides a method of manufacturing a quantum dot display panel. Referring to FIG. 2, it is a flowchart of an embodiment of the method of manufacturing the quantum dot display panel provided by the present disclosure. The method comprises step 20 to step 24.

Step 20 of providing an array substrate.

In some embodiments, the array substrate may comprise:

a glass substrate 101; and a thin film transistor layer 102 disposed on the glass substrate 101.

Step 21 of disposing a luminescent layer on the array substrate configured to provide a light source.

Step 22 of disposing an encapsulation layer on the luminescent layer, and configured to encapsulate the luminescent layer to prevent the luminescent layer from being eroded.

Step 23 of disposing a color filter layer on the encapsulation layer. The color filter layer comprises a plurality of pixel areas. Each of the pixel region comprises a plurality of sub-pixel filter layers. Each of the plurality of sub-pixel filter layers is made of a quantum dot material, and a color of the light emitted by the quantum dot material after being excited is the same as a color of the sub-pixel filter layers.

Step 24 of forming a concave structure on the upper surface of each of the plurality of the sub-pixel filter layers.

The method of manufacturing the quantum dot display panel reduces the probability of total internal reflection of light on the surface of the color filter layer of the quantum dot display panel, and more light in the color filter layer may be emitted from the quantum dot display panel, which greatly enhances the light extraction rate and the display effect of the quantum dot display panel, by forming a concave structure on the upper surface of the color filter layer of the quantum dot display panel.

In some embodiments of the present disclosure, step 21 may comprise: disposing a cathode on the array substrate; disposing a luminescent layer on the cathode configured to provide a light source; and disposing an anode on the luminescent layer.

In some embodiments, the color filter layer may comprise a plurality of sub-pixel filter layers. The step of disposing a color filter layer on the encapsulation layer may comprise:

disposing an interval section with a plurality of openings on the encapsulation layer; and disposing a plurality of sub-pixel filter layers in each of the plurality of openings to form a color filter layer, and the sub-pixel filter layers being disposed at intervals by the interval section.

Specifically, the color filter layer comprises a plurality of pixel areas, and each of the pixel areas may further comprises a plurality of sub-pixel filter layers. An interval section is disposed on the substrate by etching, and a plurality of openings are formed while disposing the interval section. Then, the interval section may space the plurality of sub-pixel filter layers apart to prevent light leakage or color mixing by disposing the sub-pixel filter layers within each of the plurality of openings.

In some embodiments, the interval section may be a black matrix.

A step of disposing the interval section with the plurality of openings on the encapsulation layer may comprise:

(1) disposing a black matrix layer on the encapsulation layer; and (2) exposing, developing and etching the black matrix layer to obtain the interval section.

Figure 3:
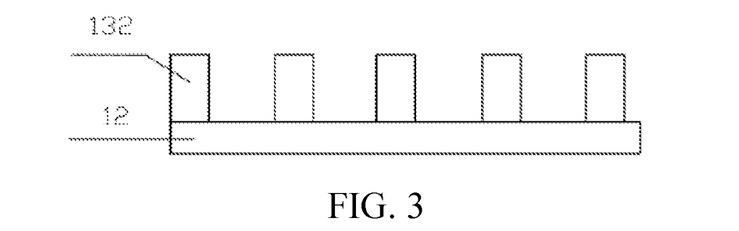
FIG. 3 is a schematic view of an interval section according to one embodiment of the present disclosure.

Specifically, the black matrix layer is prepared by coating on the substrate. When the black matrix layer is prepared, the black matrix layer is exposed, developed, and etched by using a predetermined mask to obtain the black matrix, that is, the interval section. An opening is formed between the two adjacent interval sections, and the upper surface of the interval section is a flat. As shown in FIG. 3, it is a schematic structural view of an embodiment of the interval section provided by the present disclosure. The interval sections 132 are disposed at intervals, and the openings are formed between the adjacent interval sections 132.

Figure 4:
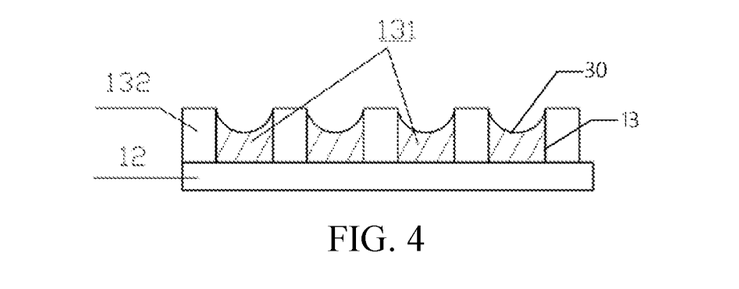
FIG. 4 is a schematic view of a color filter layer according to one embodiment of the present disclosure.

As shown in FIG. 4, it is a schematic structural view of one embodiment of the color filter layer provided by the present disclosure. A step of disposing the plurality of sub-pixel filter layers in each of the plurality of openings to form the color filter layer may comprise: disposing the plurality of sub-pixel filter layers in each of the plurality of openings to form the color filter layer, and the height of the color filter layer is less than the height of the black matrix.

The plurality of sub-pixel filter layers can be disposed by printing on the opening of the black matrix using inkjet printing technology to form the color filter layer. The color filter layer comprises a plurality of sub-pixel filter layers. Moreover, a concave structure is formed on at least one of the sub-pixel filter layers of the color filter layer, and the height of the upper surface of the sub-pixel filter layer with the concave structure is less than the height of the black matrix. Then, the plurality of the sub-pixel filter layers prepared by inkjet printing are dried and cured so that the color filter layer and the encapsulation layer are connected tightly.

It should be noted that, in the embodiments of the present disclosure, the specific processes and methods for preparing the interval space and the color filter layer may refer to the conventional technique, and no limitation is made herein.

In some embodiments of the present disclosure, the concave structure is formed on the upper surface of each of the plurality of the sub-pixel filter layers. After the preparation of the sub-pixel filter layer is completed, a concave structure may be prepared on the upper surface of the sub-pixel filter layer. The concave structure may also be disposed on the upper surface of the sub-pixel filter layer while preparing the sub-pixel filter layer.

Figure 5:
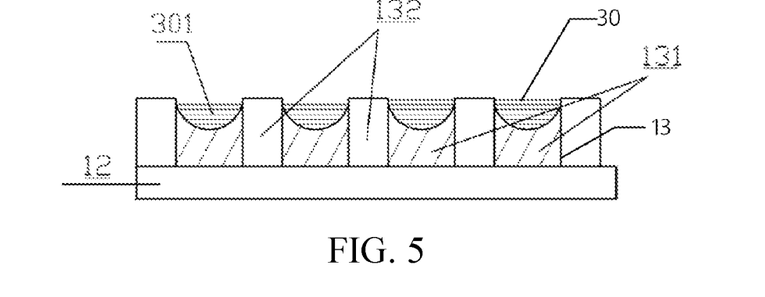
FIG. 5 is a schematic view of a light transmission layer according to one embodiment of the present disclosure.

In some embodiments, the height of the sub-pixel filter layer is less than the height of the interval section. A step of disposing a light transmission layer on the color filter layer comprises: disposing a light transmission part within the opening of the interval section to form a light transmission layer.

Since the height of the sub-pixel filter layer is less than the height of the spacer, the upper surface of the sub-pixel filter layer and the inner wall of the opening may enclose to form a receiving cavity. That is, the concave structure is formed on the upper surface of the sub-pixel filter layer, which allows a transparent material having a refractive index greater than refractive index of the color filter layer to fill the receiving cavity to form a light transmission part.

Specifically, in the concave structure, a light transmission part is prepared by inkjet printing technology to form a light transmission layer, and the light transmission layer is irradiated to by UV light curing. The refractive index of the light transmission layer is greater than the refractive index of the color filter layer, so that the light from the luminescent layer may exit the color filter layer as much as possible after entering the color filter layer, eliminating the optical waveguide effect. As shown in FIG. 5, it is a schematic structural view of an embodiment of a light transmission part provided by one embodiment of the present disclosure.

The light transmission part is disposed in the concave structure of the sub-pixel filter layer. The upper surface of the light transmission part may be a flat or concave structure. The height difference between the upper surface of the light transmission part and the upper surface of the interval section is within a predetermined range.

In some embodiments, the height difference between the upper surface of the light transmission part and the upper surface of the interval section is less than or equal to 0.2 µm. That is, the height of the upper surface of the light transmission part is less than or equal to the height of the upper surface of the interval section. Specifically, the upper surface of the light transmission part may be a flat, and the height of the upper surface of the light transmission part is equal to the height of the upper surface of the interval section; or the height difference between the lowest point of the upper surface of the light transmission part and the upper surface of the interval section may be 0.1 µm, 0.15 µm, 0.2 µm, etc.

The present disclosure further provides a display device. The display device comprises the quantum dot display panel described above. The quantum dot display panel comprises:
an array substrate;
a luminescent disposed on the array substrate configured to provide a light source;
an encapsulation layer disposed on the luminescent layer, and configured to encapsulate the luminescent layer, to prevent the luminescent layer from being eroded by moisture; and a color filter layer disposed on the encapsulation layer. The color filter layer comprises a plurality of pixel areas. Each of the plurality of pixel areas comprises a plurality of sub-pixel filter layers. Each of the plurality of the sub-pixel filter layers is made of a quantum dot material. A color of a light emitted by the quantum dot material after being excited is the same as a color of the sub-pixel filter layer. An upper surface of at least one of the sub-pixel filter layers forms a concave structure.

The display device provided by the embodiment of the disclosure forms a concave structure on the upper surface of the color filter layer of the quantum dot display panel to change the exit angle of the light in the color filter layer of the quantum dot display panel. It reduces the probability of total reflection of light on the surface of the color filter layer of the quantum dot display panel, and more light in the color filter layer may be exited from the quantum dot display panel, which greatly enhances the light extraction rate and the display effect of the quantum dot display panel.

In one embodiment of the display device provided by the present disclosure, the array substrate of the display panel may further comprise:
a glass substrate; and
a thin film transistor layer disposed on the glass substrate.

The display panel further comprises a cathode disposed on the thin film transistor layer; and an anode disposed on the luminescent layer.

Based on the above embodiment, the color filter layer is disposed on the encapsulation layer. The color filter layer comprises a plurality of pixel areas, and each of the plurality of pixel areas comprises a plurality of the sub-pixel filter layers.

Based on some embodiments of the present disclosure, the quantum dot display panel further comprises a luminescent layer. The luminescent layer is disposed on the color filter layer. The luminescent layer comprises a light transmission part. A concave structure is disposed on the upper surface of the sub-pixel filter layer, and the light transmission part is disposed on the sub-pixel filter layer and located in the concave structure.

By using the display panel as described in the above embodiments, the performance of the display device is further enhanced.

In the above embodiments, the description of each embodiment has its own emphasis. For a part that is not detailed in one certain embodiment, please refer to the above detailed description for other embodiments, and details are not further described herein.

During specific implementation, the above units or structures may be implemented as independent entities, or may also be implemented by any combination and implemented as the same or several entities. For the specific implementation of the above units or structures, please refer to the embodiments of method described above, and details are not further described herein.

The specific implementation of the above operations may refer to the embodiments described above and would not be further described herein.

The quantum dot display panel and method of manufacturing thereof, and display device provided in the embodiments of the present disclosure have been described in detail above. Specific examples are used in this content to explain the principles and implementation of the present disclosure. In order to help understand the method of the present disclosure and its core concept; at the same time, for a person skilled in the art, according to the concept of the present disclosure, the specific implementation process and the scope of application may be change. In summary, the content of this specification should not be construed as a limitation of the present disclosure.

What is claimed is:

1. A quantum dot display panel, comprising:
an array substrate;
a luminescent layer disposed on the array substrate configured to provide a light source;
an encapsulation layer disposed on the luminescent layer, and configured to encapsulate the luminescent layer;
a color filter layer disposed on the encapsulation layer, wherein the color filter layer comprises a plurality of pixel areas, wherein each of the plurality of pixel areas comprises a plurality of sub-pixel filter layers, wherein each of the plurality of sub-pixel filter layers is made of a quantum dot material, wherein a color of a light emitted by the quantum dot material after being excited is the same as a color of tight emitted from the plurality of sub-pixel filter layers; and wherein an entire upper surface of each of the plurality of sub-pixel filter layers forms a respective concave structure, which together constitute a plurality of concave structures; and
a transmission layer disposed on the plurality of sub-pixel filter layers, and comprising a plurality of light transmission parts, wherein each of the plurality of light transmission parts correspondingly covers each of the plurality of concave structures.

2. The quantum dot display panel according to claim 1, wherein a refractive index of the transmission layer is higher than a refractive index of the color filter layer.

3. The quantum dot display panel according to claim 2, wherein a lower part of each of the plurality of light transmission parts correspondingly fills the plurality of concave structures.

4. The quantum dot display panel according to claim 1, wherein the color filter layer further comprises an interval section, and wherein the plurality of sub-pixel filter layers are disposed at intervals by the interval section.

5. The quantum dot display panel according to claim 4, wherein a height of the plurality of sub-pixel filter layers is less than or equal to a height of the interval section.

6. The quantum dot display panel according to claim 1, wherein shapes of the plurality of concave structures are the same.

7. The quantum dot display panel according to claim 1, wherein the luminescent layer is a blue light source, and the plurality of sub-pixel filter layers comprises a red sub-pixel filter layer, a green sub-pixel filter layer, and a blue sub-pixel filter layer; wherein the red sub-pixel filter layer is made of a red quantum dot material, the green sub-pixel filter layer is made of a green quantum dot material, and the blue sub-pixel filter layer is a transparent layer.

8. The quantum dot display panel according to claim 1, wherein the color filter layer further comprises an interval section provided with a plurality of openings, and the plurality of sub-pixel filter layers are disposed in the plurality of openings one-to-one; and
wherein a side surface of each of the plurality of sub-pixel filter layers is directly contacted with a sidewall of each of the plurality of openings.

9. The quantum dot display panel according to claim 1, wherein the color filter layer further comprises an interval section provided with a plurality of openings, and the plurality of sub-pixel filter layers are disposed in the plurality of openings one-to-one; and
wherein a height of an upper surface of each of the plurality of light transmission parts is less than or equal to a height of an upper surface of the interval section, and a side surface of each of the plurality of light transmission parts is directly contacted with a sidewall of each of the plurality of openings.

10. The quantum dot display panel according to claim 1, wherein the color filter layer further comprises an interval section provided with a plurality of openings, and the plurality of sub-pixel filter layers are disposed in the plurality of openings one-to-one; and
wherein a height of an upper surface of each of the plurality of light transmission parts is less than or equal to a height of an upper surface of the interval section.

11. The quantum dot display panel according to claim 9, wherein the height of the upper surface of each of the plurality of light transmission parts is less than the height of the upper surface of the interval section, and a height difference between the upper surface of each of the plurality of light transmission parts and the upper surface of the interval section is less than or equal to 0.2 μm.

12. The quantum dot display panel according to claim 1, wherein an upper surface of each of the plurality of light transmission parts is a flat surface.

13. A method of manufacturing a quantum dot display panel, comprising:

providing an array substrate;
disposing a luminescent layer on the array substrate configured to provide a light source;
disposing an encapsulation layer on the luminescent layer, and configured to encapsulate the luminescent layer;
disposing a color filter layer on the encapsulation layer, wherein the color filter layer comprises a plurality of pixel areas, wherein each of the plurality of pixel areas comprises a plurality of sub-pixel filter layers, wherein each of the plurality of sub-pixel filter layers is made of a quantum dot material, and wherein a color of a light emitted by the quantum dot material after being excited is the same as a color of light emitted from the plurality of sub-pixel filter layers; and wherein an entire upper surface of each of the plurality of sub-pixel filter layers forms a respective concave structure, which together constitute a plurality of concave structures; and
disposing a transmission layer on the plurality of sub-pixel filter layers, wherein the transmission layer comprises a plurality of light transmission parts, and wherein each of the plurality of light transmission parts correspondingly covers each of the plurality of concave structures.

14. The method of manufacturing the quantum dot display panel according to claim 13, wherein a step of disposing the color filter layer on the encapsulation layer comprises:
disposing an interval section on the encapsulation layer, wherein the interval section comprises a plurality of openings; and
disposing the plurality of sub-pixel filter layers in the plurality of openings to form the color filter layer, and wherein the plurality of sub-pixel filter layers are disposed at intervals by the interval section.

15. The method of manufacturing the quantum dot display panel according to claim 13,
wherein a refractive index of the transmission layer is higher than a refractive index of the color filter layer.

16. The method of manufacturing the quantum dot display panel according to claim 13, wherein the color filter layer further comprises an interval section provided with a plurality of openings, and the plurality of sub-pixel filter layers are disposed in the plurality of openings one-to-one; and
wherein a side surface of each of the plurality of sub-pixel filter layers is directly contacted with a sidewall of each of the plurality of openings.

17. The method of manufacturing the quantum dot display panel according to claim 13, wherein the color filter layer further comprises an interval section provided with a plurality of openings, and the plurality of sub-pixel filter layers are disposed in the plurality of openings one-to-one; and
wherein a height of an upper surface of each of the plurality of light transmission parts is less than or equal to a height of an upper surface of the interval section, and a side surface of each of the plurality of light transmission parts is directly contacted with a sidewall of each of the plurality of openings.

18. The method of manufacturing the quantum dot display panel according to claim 13, wherein the color filter layer further comprises an interval section provided with a plurality of openings, and the plurality of sub-pixel filter layers are disposed in the plurality of openings one-to-one; and
wherein a height of an upper surface of each of the plurality of light transmission parts is less than or equal to a height of an upper surface of the interval section.

19. The method of manufacturing the quantum dot display panel according to claim 18, wherein the height of the upper surface of each of the plurality of light transmission parts is less than the height of the upper surface of the interval section, and a height difference between the upper surface of each of the plurality of light transmission parts and the upper surface of the interval section is less than or equal to 0.2 µm.

20. A method of manufacturing a quantum dot display panel, comprising:

providing an array substrate;

disposing a luminescent layer on the array substrate configured to provide a light source;

disposing an encapsulation layer on the luminescent layer, and configured to encapsulate the luminescent layer;

disposing a color filter layer on the encapsulation layer, wherein the color filter layer comprises a plurality of pixel areas, wherein each of the plurality of pixel areas comprises a plurality of sub-pixel filter layers, wherein each of the plurality of sub-pixel filter layers is made of a quantum dot material, and wherein a color of a light emitted by the quantum dot material after being excited is the same as a color of light emitted from the plurality of sub-pixel filter layers; wherein an entire upper surface of each of the plurality of sub-pixel filter layers forms a respective concave structure, which together constitute a plurality of concave structures;

disposing a plurality of light transmission parts in the plurality of concave structures to form a transmission layer, wherein a refractive index of the transmission layer is higher than a refractive index of the color filter layer, and wherein each of the plurality of light transmission parts correspondingly covers each of the plurality of concave structures;

wherein a step of disposing the color filter layer on the encapsulation layer comprises:

disposing an interval section on the encapsulation layer, wherein the interval section comprises a plurality of openings; and disposing the plurality of sub-pixel filter layers in the plurality of openings to form the color filter layer, and wherein the plurality of sub-pixel filter layers are disposed at intervals by the interval section.

\* \* \* \* \*